US008441103B2

(12) United States Patent
Kemerer et al.

(10) Patent No.: US 8,441,103 B2
(45) Date of Patent: May 14, 2013

(54) EMBEDDED SERIES DEEP TRENCH CAPACITORS AND METHODS OF MANUFACTURE

(75) Inventors: Timothy W. Kemerer, Essex Junction, VT (US); James S. Nakos, Essex Junction, VT (US); Steven M. Shank, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/349,158

(22) Filed: Jan. 12, 2012

(65) Prior Publication Data
US 2012/0104551 A1 May 3, 2012

Related U.S. Application Data

(62) Division of application No. 12/575,989, filed on Oct. 8, 2009, now Pat. No. 8,143,135.

(51) Int. Cl.
| H01L 29/00 | (2006.01) |
| H01L 27/108 | (2006.01) |
| H01L 29/76 | (2006.01) |
| H01L 29/94 | (2006.01) |
| H01L 31/119 | (2006.01) |

(52) U.S. Cl.
USPC ............ 257/534; 257/301; 257/302; 257/306

(58) Field of Classification Search ............ 257/534, 257/532, 296, 301, 302, 135, 136, 242, 329, 257/263, 270, 295, 310, 303, 311, 312, 306, 257/307
See application file for complete search history.

(56) References Cited

U.S. PATENT DOCUMENTS

| 4,645,564 | A | 2/1987 | Morie et al. |
| 4,918,502 | A * | 4/1990 | Kaga et al. ............. 257/304 |
| 5,275,974 | A | 1/1994 | Ellul et al. |
| 6,236,079 | B1 | 5/2001 | Nitayama et al. |
| 6,259,149 | B1 | 7/2001 | Burkhardt et al. |
| 6,344,413 | B1 | 2/2002 | Zurcher et al. |
| 6,455,369 | B1 | 9/2002 | Forster et al. |
| 6,750,096 | B2 | 6/2004 | Steck et al. |
| 6,954,921 | B2 | 10/2005 | Hassibi et al. |
| 6,972,451 | B2 | 12/2005 | Delpech et al. |
| 7,122,439 | B2 | 10/2006 | Kwon et al. |
| 7,170,125 | B2 | 1/2007 | Seidl et al. |
| 7,344,953 | B2 | 3/2008 | Hecht et al. |
| 7,554,148 | B2 | 6/2009 | Su et al. |

(Continued)

OTHER PUBLICATIONS

C.C.-H Hsu et al., "A High Speed, Low Power P-Channel Flash EEPROM Using Silicon Rich Oxide as Tunneling Dielectric" 1992, pp. 140-142.

(Continued)

*Primary Examiner* — Chuong A. Luu
(74) *Attorney, Agent, or Firm* — Anthony Canale; Roberts Mlotkowski Safran & Cole, P.C.

(57) ABSTRACT

Trench capacitors and methods of manufacturing the trench capacitors are provided. The trench capacitors are very dense series capacitor structures with independent electrode contacts. In the method, a series of capacitors are formed by forming a plurality of insulator layers and a plurality of electrodes in a trench structure, where each electrode is formed in an alternating manner with each insulator layer. The method further includes planarizing the electrodes to form contact regions for a plurality of capacitors.

11 Claims, 7 Drawing Sheets

U.S. PATENT DOCUMENTS

| | | |
|---|---|---|
| 2004/0232557 A1 | 11/2004 | Kim |
| 2005/0110114 A1 | 5/2005 | Lu et al. |
| 2006/0134877 A1 | 6/2006 | Goebel et al. |
| 2006/0194348 A1 | 8/2006 | Araujo et al. |
| 2007/0058458 A1 | 3/2007 | Pan |
| 2007/0059879 A1 | 3/2007 | Ting |
| 2007/0148899 A1 | 6/2007 | Kim |
| 2007/0296010 A1* | 12/2007 | Su et al. ............ 257/301 |
| 2008/0048232 A1* | 2/2008 | Su et al. ............ 257/301 |
| 2008/0291601 A1 | 11/2008 | Roozeboom et al. |
| 2009/0072313 A1 | 3/2009 | Cai et al. |
| 2009/0134925 A1 | 5/2009 | Cannon et al. |

OTHER PUBLICATIONS

D.J. DiMaria et al., "High current injection into SiO2 from Si rich SiO2 films and experimental applications" Jan. 23, 1980, pp. 2722-2735.

* cited by examiner

Pinched or closed tabbed portions "TP"

Remaining portion of trench remains open

EMBEDDED SERIES DEEP TRENCH CAPACITORS AND METHODS OF MANUFACTURE

CROSS REFERENCE TO RELATED APPLICATIONS

The present application is a divisional application of U.S. application Ser. No. 12/575,989, filed on Oct. 8, 2009 now U.S. Pat. No. 8,143,135, the contents of which are incorporated by reference in its entirety herein.

FIELD OF THE INVENTION

The invention relates to semiconductor structures and methods of manufacture and, more particularly, to trench capacitors and methods of manufacturing the same.

BACKGROUND

Capacitors are used to store charge in integrated circuits (ICs) such as in DRAM and SRAM cells. However, the growing demand for increasingly smaller and thus more cost effective semiconductor devices, e.g., with large memory capacities, has pushed the development of miniaturized structures in sub-micron technologies. But such miniaturization has its limits. For example, the size of the capacitor becomes increasingly larger with regard to the circuit itself, thus taking up considerable chip real estate. For example, current solutions for series capacitors connect two independent capacitors at metal levels; however, this arrangement takes more real estate in order to provide improved capacitors. Additionally, a typical capacitor can use a MIM (Metal-Insulator-Metal) structure for dense applications, but the values of these capacitors are reducing with each generation due to lack of area as they are planar capacitors.

Also, in certain applications, the capacitor can become easily disrupted due to radiation or other unwanted external discharging events. By way of example, for certain radiation hardened applications the use of a dual capacitor dual, resistor feedback has been used. These structures, though, take up a considerable amount of real estate, f, or example. Other applications include a single capacitor and two resistor configuration which is believed to be more robust to exposure to high radiation environments such as space applications. However, this approach places additional requirements on the properties of the capacitor. In particular, both electrodes cannot be contacting any part of the silicon, either diffusion or substrate. If they are in contact, a radiation event will upset the SRAM cell, regardless of where the energetic ions or particles hit the cell. For example, in a radiation environment, electron hole pairs (e.g., carriers of electric charge) will be swept to a voltage potential which, in turn, will disrupt the state of the capacitor.

Accordingly, there exists a need in the art to overcome the deficiencies and limitations described hereinabove.

SUMMARY

In a first aspect of the invention, a method of forming a series of capacitors comprises forming a plurality of insulator layers and a plurality of electrodes in a trench structure, where each of the plurality of electrodes are formed in an alternating manner with each of the plurality of insulator layers. The method further comprises planarizing at least each of the plurality of electrodes to form contact regions for a plurality of capacitors formed from the plurality of insulator layers and the plurality of insulator electrodes.

In another aspect of the invention, a method comprises: forming a first trench in a shallow trench isolation structure having a first width; forming a second trench through the first trench, the second trench being deeper than the first trench and having a second width different than the first trench; alternately depositing a plurality of insulator material and electrode material in the first trench and the second trench until the first trench and the second trench are filled; and planarizing the deposited insulator material and the electrode material to form contact regions for at least a first capacitor and a second capacitor.

In yet another aspect of the invention, a structure comprises a first capacitor formed in a deep trench and a second capacitor formed in the deep trench. The first capacitor comprises two electrode plates sandwiched around an insulator. The second capacitor comprises two electrode plates separated by an insulator. The first capacitor and the second capacitor share a common electrode plate.

In another aspect of the invention, there is a design structure tangibly embodied in a machine readable medium used for designing, manufacturing, or testing an integrated circuit. The design structure includes the method steps and/or structure of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to trench capacitors and methods of manufacturing the trench capacitors. In embodiments, the present invention is more specifically directed to the formation of a very dense series capacitor structure with independent electrode contacts and methods of manufacture. Advantageously, the present invention provides increased capacitance for a given wafer area. This can be accomplished by virtue of having a plurality of capacitors with same type of electrodes, e.g., same electrode material deposited in a series of deposition steps, for the capacitors. Additionally, the trench capacitors offer advantages in values for a give area due to its three dimensional structure. The method of manufacturing the trench and related capacitor plates also provides a dense plurality of capacitors with using local interconnects.

In more specific embodiments, the present invention provides a plurality of capacitors formed in a single deep trench. The plurality of capacitors can be two or more capacitors with the requisite number of electrodes or capacitor plates. For example, the present invention contemplates the use of three electrodes for two capacitors formed in a single trench. In this embodiment, a single electrode can be common to both capacitors. Those of skill in the art should understand that more than three electrodes can be formed in the trench to form more than two capacitors in the single trench.

The trench may be formed in a substrate or wiring level and may be lined with an insulator layer. In embodiments, a first capacitor plate (electrode) is formed on the insulator layer, which can have an exposed portion extending onto an upper surface of the substrate/wiring level to provide a first contact region to the first capacitor plate. A second capacitor plate can be filled into the trench on a first capacitor dielectric layer, where the second capacitor plate comprises an exposed portion that extends onto an upper surface of the substrate/wiring level to provide a second contact region to the second capacitor plate. A second capacitor dielectric layer can be formed on the second capacitor plate and a third capacitor plate can be formed on the second capacitor dielectric layer. The third capacitor plate comprises an exposed portion that extends onto an upper surface of the substrate/wiring level to provide a third contact region to the third capacitor plate. In embodiments, additional capacitor plates can be formed in a similar manner, to provide additional contacts and hence additional capacitors in the single trench, or can be implemented using the substrate itself.

Figure 1:
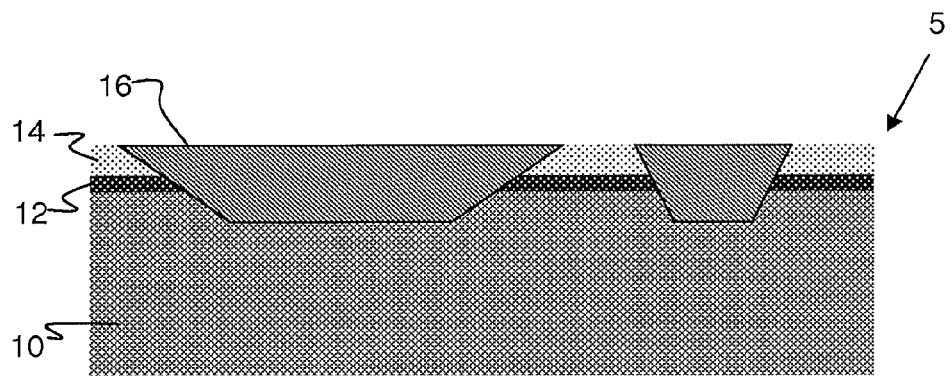
FIGS. 1-6, 6a and 7-12 show processes for forming a series of trench capacitors and respective views of structures in accordance with aspects of the invention.

FIG. 1 shows a starting structure and respective processing steps to form deep trench series capacitors in accordance with an aspect of the invention. The structure 5 includes a substrate 10, which can be made from any conventional substrate material such as, for example, Si, SiGe, GaAs, SOI, SiC, etc. In embodiments, the substrate 10 is approximately 750 microns; although other dimensions are contemplated by the present invention. A thin pad film 12 is deposited on the substrate 10 using a conventional deposition process such as, for example, chemical vapor deposition (CVD), low pressure chemical vapor deposition (LPCVD) or atomic layer deposition (ALD). In embodiments, the thin pad film 12 can be, for example, silicon dioxide, and can have a thickness of about 100 Å. However, those of skill in the art will realize that the thickness of the thin pad film 12 can range from about 50 Å to about 150 Å (or other dimensions).

A second film 14 is deposited on the pad film 12. In embodiments, the deposition processes for depositing the second film 14 can be, for example, chemical vapor deposition (CVD), low pressure chemical vapor deposition (LPCVD) or atomic layer deposition (ALD) processes. In embodiments, the second film 14 can be, for example, silicon nitride. The second film 14 can have a thickness of about 1500 Å; although other dimensions are also contemplated by the present invention. For example, the second pad film 14 can range from about 1000 Å to about 3000 Å.

Still referring to FIG. 1, a plurality of shallow trench isolation structures 16 are formed using conventional lithographic, etching and deposition processes. The shallow trench isolation structures 16 can be, for example, a silicon oxide material extending into the substrate 10. In an illustrative example for forming the shallow trench isolation structures 16, a photoresist is deposited on the second film 14, and selective portions of the resist are exposed to form openings. In subsequent processes, the substrate 10 and layers 12 and 14 are etched using a conventional etching process such as, for example, reactive ion etching (RIE), to form trenches. In further processing, the trenches are filled with insulator material, e.g., silicon oxide, to form the shallow trench isolation (STI) structures 16. In embodiments, the resist can be stripped away and the structure polished to provide the structure of FIG. 1. As shown, the pad layers 12 and 14 remain after the polishing process.

Figure 2:
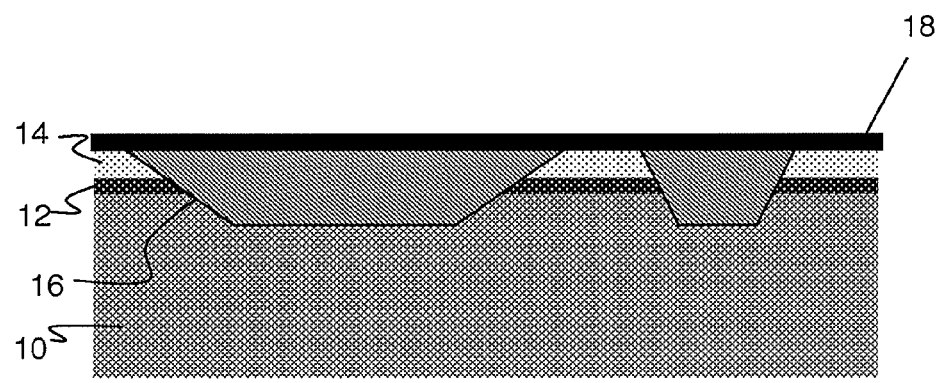

FIG. 2 shows an intermediate structure and respective processing steps in accordance with the invention. More particularly, after formation of the STI structures 16, a cap layer 18 is deposited on the structure of FIG. 1. The cap layer 18 can be, for example, a nitride cap. The cap layer 18 can have a thickness of about 500 Å; although other dimensions are contemplated by the present invention.

Figure 3:
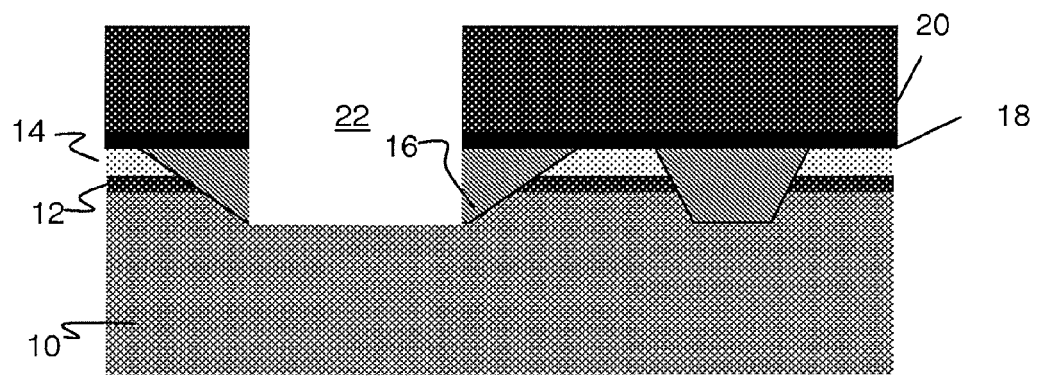

In FIG. 3, a mask layer 20 is deposited on the structure of FIG. 2. For example, the mask layer may be a conventional photoresist mask 20. Through a conventional lithographic process, an opening is formed in the mask 20 and an etching process is performed to form a trench 22 to the STI 16. The trench 22 can be scaled with the node such as, for example, a 0.13 or 0.18 node, and can, for example, have a depth of about 0.4 microns and a width of about 0.5 microns. The mask 20 is stripped and the structure cleaned using a conventional process.

Figure 4:
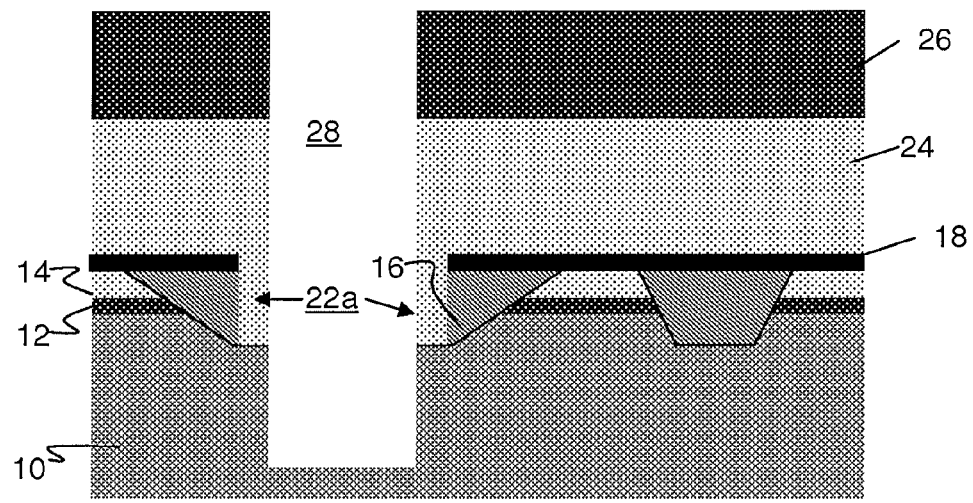

As seen in FIG. 4, a boro-silicate-glass (BSG) layer 24 is deposited on the structure of FIG. 3. More specifically, the BSG layer 24 is deposited in the trench 22 and on the layer 18 using a conventional deposition process such as, for example, a blanket low pressure chemical vapor deposition technique (LPCVD). A resist layer 26 is deposited on the BSG 24, and an opening is formed in the resist layer 26 using a conventional lithographic process. A trench 28 is etched into the structure using a conventional etchant. More specifically, the trench 28 is etched into the structure, extending to the substrate 10. In embodiments, the central axis of the trench 28 is substantially coincident with the central axis of the filled trench 22, e.g., the axes of the trenches are coaxial. The trench 28 is approximately 0.2 microns wide and approximately 5 to 10 microns deep, depending on the depth of the original trench 22 and STI structure 16. After the etching process, the BSG 24 remains within portions of the trench, e.g., at the lip 22a formed by the trench 22, adjacent to the STI material and layer 18. The excess BSG and resist are subsequently stripped using conventional stripping processes.

Figure 5:
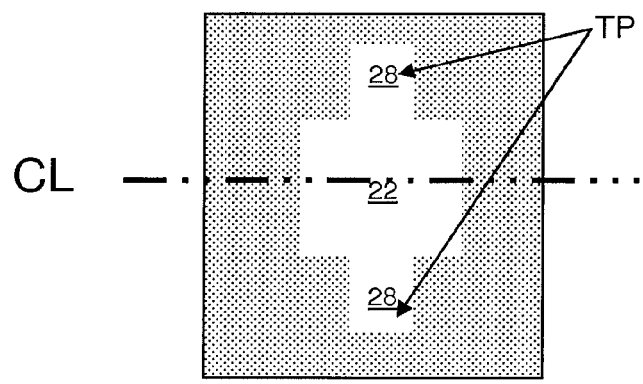

FIG. 5 is a top view of the structure of FIG. 4. As seen in FIG. 5, the trench 28 will form tabbed portions "TP" extending from the area formed by the trench 28. The tabbed portions "TP" can have a width of about 0.2 microns; although other dimensions are contemplated by the invention; whereas, the area formed by the trench 28 has a width of about 0.5 microns (although other dimensions are also contemplated by the invention). In embodiments, the tabbed portions "TP" have a width that will be pinched off or closed (prior to the area formed by the trench 28) during subsequent deposition processes forming a desired number of capacitor plates. As should be understood by those of skill in the art, capacitors can be formed between the tabbed portions.

Still referring to FIG. 5, as should be understood by those of skill in the art, three or more tabbed portions are also contemplated by the invention. The tabbed portions can be formed on any of combination of sides of the trench 22, depending on the desired arrangement of the resulting capacitors. For example, the two or more capacitors can be arranged in series or parallel, depending on the placement of the tabbed portions (and subsequently exposed regions).

Figure 6:
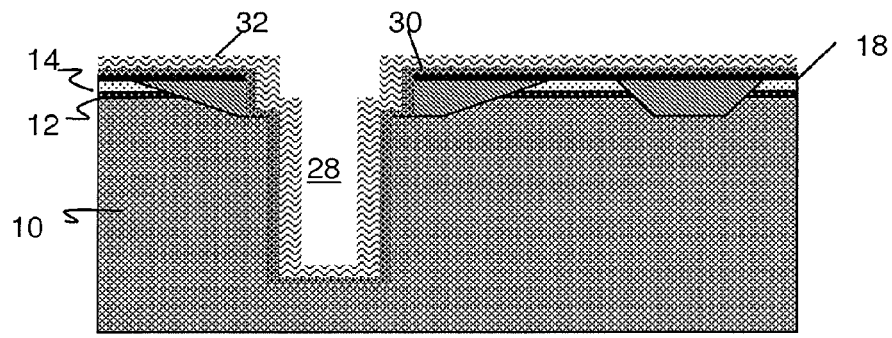
Figure 6A:
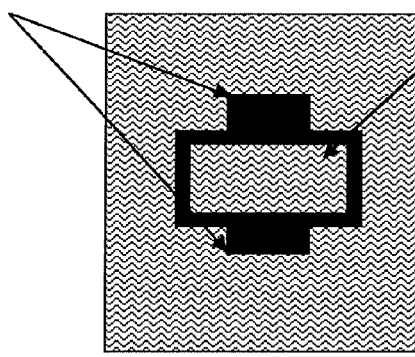

In FIG. 6, an insulator layer 30 is blanket deposited over the structure of FIG. 4 using, for example, a conventional CVD process. In embodiments, the insulator layer 30 is Oxide-Nitride-Oxynitride (ONO), silicon nitride or silicon dioxide. The insulator layer 30 can be deposited in the trench 28 and over the layer 18 to a thickness of about 20 nm; although other dimensions are contemplated by the present invention. A poly layer 32 is blanket deposited on the insulator layer 30 to a thickness of about, e.g., 100 nm to 120 nm. In embodiments, the poly layer 32 may be As doped polysilicon or boron doped polysilicon. Alternatively, the poly layer 32 can be $WSi_2$ (or other conductive material), for example. In embodiments, the layer 32 will form a first electrode of a capacitor. In the embodiment shown in FIG. 6, the deposited layers 30 and 32 will pinch off or close the tabbed portions "TP" as shown in FIG. 6a.

Figure 7:
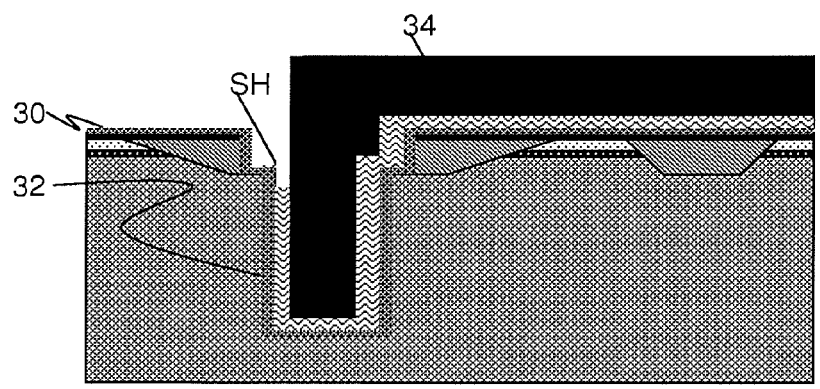

As shown in FIG. 7, a resist 34 is deposited on the structure of FIG. 6 using a conventional deposition process. As discussed below, the processes described in FIG. 7 can be optional. In any event, after the resist is deposited, an opening is patterned in the resist 34 using a conventional lithographic process. The opening will expose a portion of the poly layer 32. In embodiments, the opening will be formed over one of the tabbed portions; whereas, the resist 34 remains over, e.g., protects, the other tabbed portion. In alternative embodiments, the resist can also be used to protect additional tabbed portions.

The structure of FIG. 7 then undergoes an etching process to remove a portion of the exposed poly layer 32, i.e., in the unprotected tabbed portion. The etching will form a shoulder pattern (represented as "SH" as shown in FIG. 7), selective to the layer 30. For example, the etching is selective to the poly layer 32 and will not etch through the underlying layer 30, e.g., oxide layer; that is, the underlying layer 30 will remain on the structure. The resist is then stripped and the structure cleaned using conventional processes.

Figure 8:
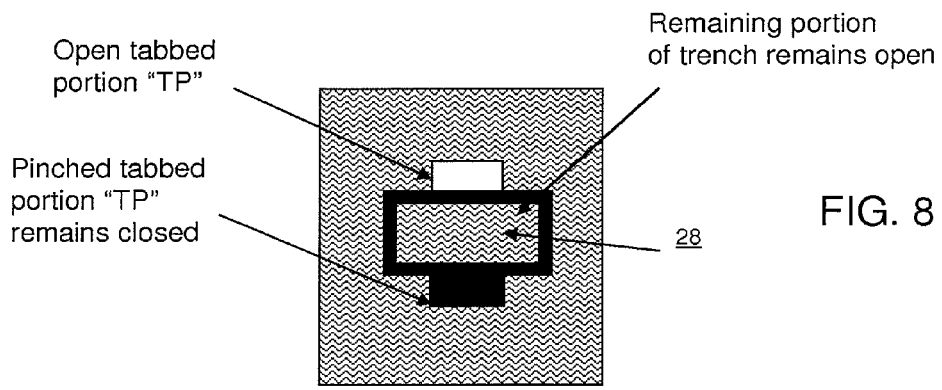

FIG. 8 shows a top view of the structure of FIG. 7. This view shows an open or cleaned tabbed portion which resulted from the etching process described with reference to FIG. 7. This view also shows the other tabbed portion(s) remains pinched off or closed which resulted from the resist protecting such area during the etching process described with reference to FIG. 7. The remaining portion of the trench (area formed by the trench 22) will remain open for deposition of subsequent layers.

Figure 9:
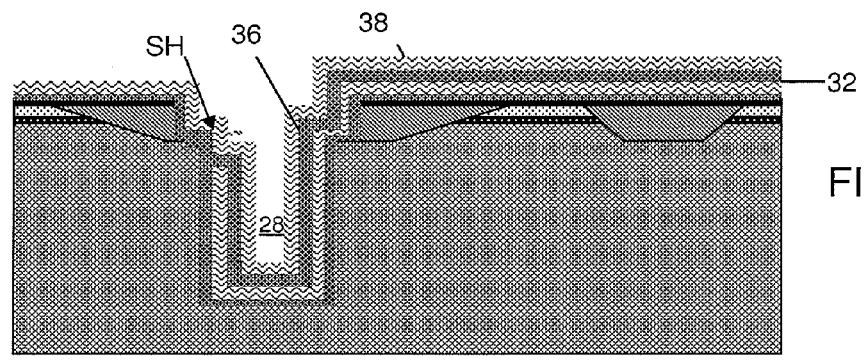

In FIG. 9, an insulator layer 36 is deposited on the structure of FIG. 7. More specifically, the insulator layer 36 is deposited on the poly layer 32, including within the trench 28 and shoulder "SH" using, for example, a conventional CVD process. In embodiments, the insulator layer 36 is Oxide-Nitride-Oxynitride (ONO), silicon nitride or silicon dioxide. A poly layer 38 is blanket deposited on the insulator layer 34 to form a second electrode of the capacitor. In embodiments, the poly layer 38 may be As doped polysilicon or boron doped polysilicon. Alternatively, the poly layer 32 can be $WSi_2$ (or other conductive material), for example. As should be understood by those of skill in the art, the layer 38 will form a second electrode of the capacitor.

Figure 10:
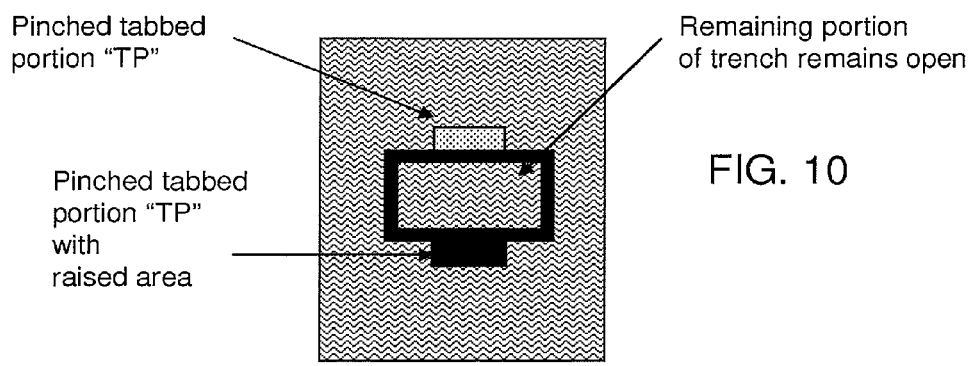

In the embodiment shown in FIG. 9, the deposited layers 36 and 38 will have a combined thickness to pinch off or close the cleaned tabbed portion "TP" shown in FIG. 10, while also forming a raised area (shown on the right side of FIG. 9) over layer 32. That is, the deposited layers 36 and 38 will have a combined thickness to pinch off or close the cleaned tabbed portion "TP" that was shown to be opened in FIG. 8, and also provide a raised area on the tabbed portion that was shown to be closed in FIG. 8. As should be understood by those of skill in the art, the raised area corresponds to the protected area (e.g., first electrode) shown in FIG. 8. The remaining portion of the trench (area formed by the trench 22) will remain open for deposition of subsequent layers.

FIG. 10 shows a top view of the structure of FIG. 9. As seen in this view, the deposited layers 36 and 38 pinch off or close the cleaned tabbed portion "TP" shown in FIG. 8, while also forming a raised area over layer 32. A center of the trench, though, remains open, i.e., is not closed or pinched off, due to its original dimension (width).

Figure 11:
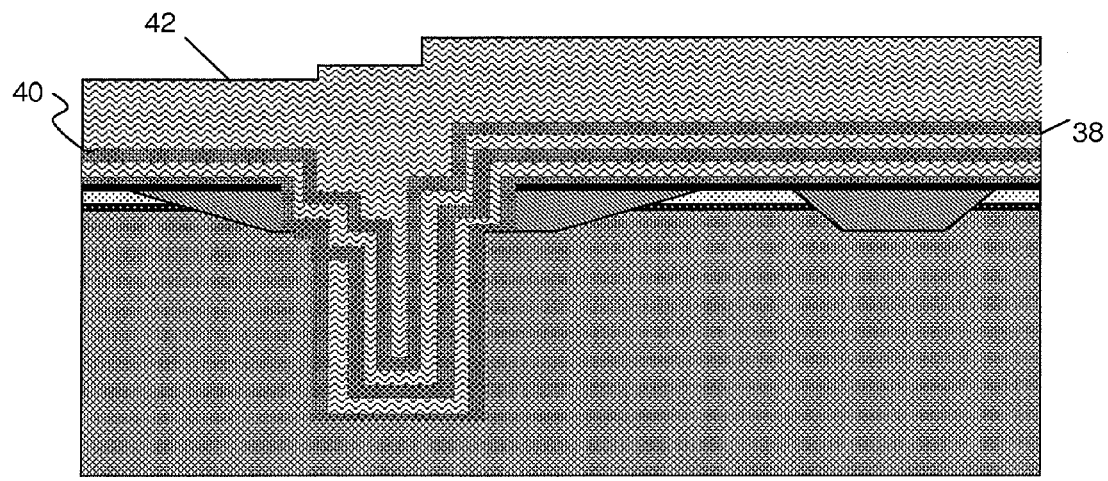

In FIG. 11, an insulator layer 40 is deposited on the structure of FIG. 10. More specifically, the insulator layer 40 is deposited on the poly layer 38, including within the trench using, for example, a conventional CVD process. In embodiments, the insulator layer 40 is Oxide-Nitride-Oxynitride (ONO), silicon nitride or silicon dioxide. A poly layer 42 is blanket deposited on the insulator layer 40 to form a third electrode of the capacitor structure (e.g., a capacitor plate or electrode of one capacitor in the series of capacitors formed in the trench). In embodiments, the poly layer 42 may be As doped polysilicon, boron doped polysilicon. Alternatively, the poly layer 42 can be $WSi_2$ (or other conductive material), for example. In the embodiment shown in FIG. 11, the deposited layers 42 and 44 will have a combined thickness to pinch off or close the remaining portions of the trench. That is, the deposited layers 42 and 44 will have a combined thickness to pinch off or close the opening shown in FIG. 10.

Figure 12:
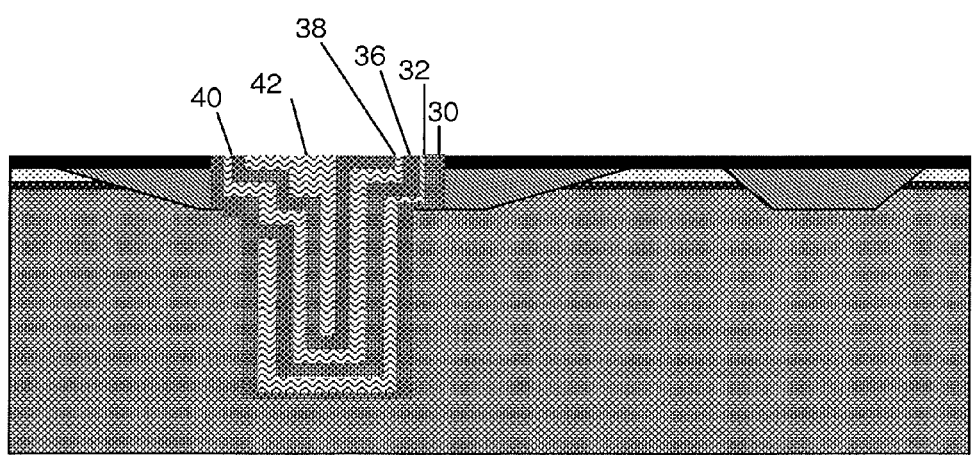

FIG. 12 shows a final structure in accordance with the invention. In particular, FIG. 12 shows a chemical mechanical polishing (CMP) process to planarize the structure and to expose all of the layers 30, 36, 38, 40 and 42. In this way, the planarizing process will provide contact regions.

In the embodiment shown in FIG. 12, the poly layers 38 and 42 will form electrodes or capacitor plates for a first deep trench capacitor and poly layers 32 and 38 will form electrodes or capacitor plates for a second deep trench capacitor, in accordance with the invention. Also, in embodiments, the poly layer 32 and the substrate 10 can form electrodes or capacitor plates for another capacitor. Advantageously, the capacitor values of each of the capacitors can be adjusted by selectively depositing each of the insulator layers 36, 40 to a different thickness. Also, the structure is symmetric with respect to the electrode material, which will lead to better capacitance parameters than existing technologies. In embodiments, there is an additional capacitor between the substrate and the poly layer 32 which can be adjusted with the thickness of layer 30.

In further embodiments, the final structure of the present invention can include two or more capacitors, depending on the initial width of the trench, the number of tabbed portions and/or the thickness of the deposited poly and insulator layers. For example, the present invention contemplates the formation of three or more capacitors formed in the deep trench by depositing additional poly layers (interposed with insulator layers). This can be accomplished using the processes described above, with either a wider trench or thinner layers 30, 36, 38, 40 and 42.

Additionally, different capacitor arrangements can be formed by contacting and/or shorting different electrodes. With regard to different capacitor arrangements, for example, the poly layers 32 and 42 can be used as a shared electrode for two capacitors in series. Thus, two capacitors can share a common electrode plate. On the other hand, two capacitors can be arranged in parallel by placing a contact on the poly layer 38 and shorting the poly layers 32 and 42.

Figure 13:
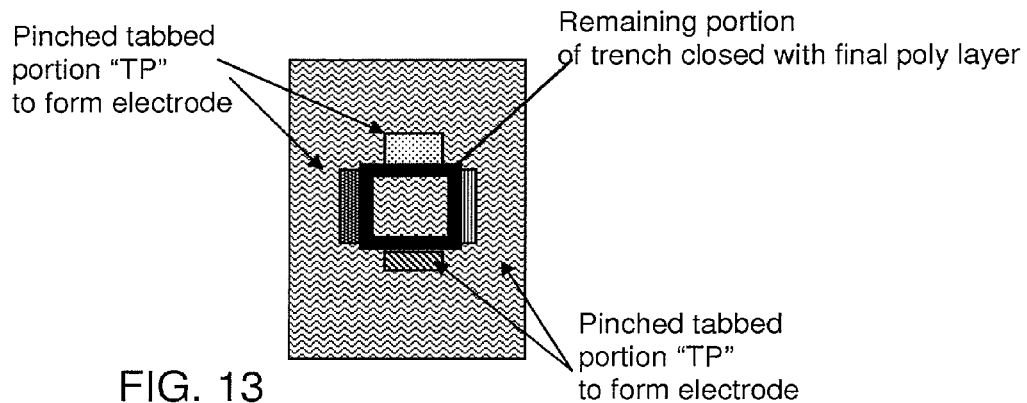
FIG. 13 shows a structure in accordance with additional aspects of the invention.

Also, different capacitor arrangements can be formed by, for example, forming three or more tabbed portions and/or arranging the tabbed portions on different sides of the trench as representatively shown in FIG. 13. For example, in embodiments, it is contemplated that the intermediate structure of the present invention can include two, three or four tabbed portions, formed on different sides of the trench. In the processes described above, the trenches can be separately pinched off or closed using the processes described above, to form different electrodes. Other shapes could produce more tabs such as, for example, a pentagon with five tabs.

Figure 14:
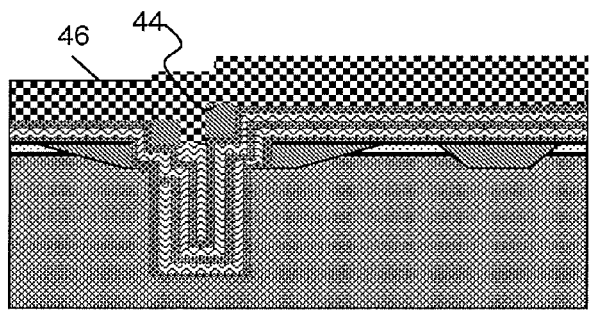
FIGS. 14 and 15 show processes for forming a series of trench capacitors and respective views of structures in accordance with aspects of the invention.
Figure 15:
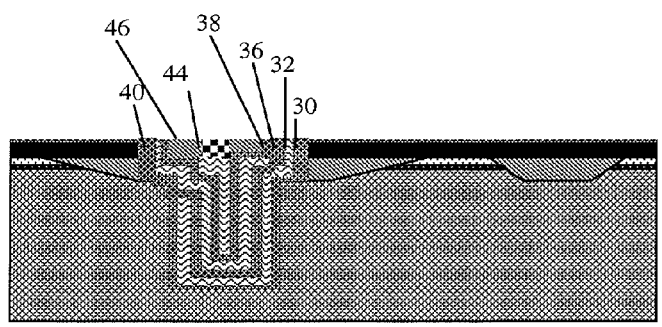

Referring to FIGS. 14 and 15, optional processes are shown in accordance with aspects of the invention to provide further insulative properties. In particular, FIG. 14 shows an etching process of the poly layer 46. This etching process can be, e.g., selective to the layer 40, e.g., selective to an oxide layer. In embodiments, the etching process can be performed without the need for a mask, as the etchant can be selective to the oxide layer (e.g., the etchant will not etch through the underlying layer 40 (See, FIG. 15)).

In the embodiments of FIGS. 14 and 15, the etching process will recess the poly layer in the tabbed portions. In a subsequent process, an oxide material is deposited into the recessed portion using conventional deposition processes. The oxide material is then selectively etched to the underlying layer 40 thereby forming oxide sidewalls 44. A poly layer 46 is deposited over the sidewalls 44 and in contact with the underlying poly layer 42 to form the third electrode contact. In embodiments, the poly layer 46 may be As doped polysilicon, boron doped polysilicon. Alternatively, the poly layer 46 can be $WSi_2$ (or other conductive material), for example. In this way, the sidewalls 44 will provide an improved insulator between the electrodes (e.g., poly layer and insulator layer 40) thereby preventing shorting between electrodes.

FIG. 15 shows a final structure and respective processing steps in accordance with the embodiment of FIG. 14. As previously discussed, a CMP process will expose the three electrodes which form two capacitors in a single trench. As in the previous embodiments, the planarizing process will provide contact regions.

Figure 16:
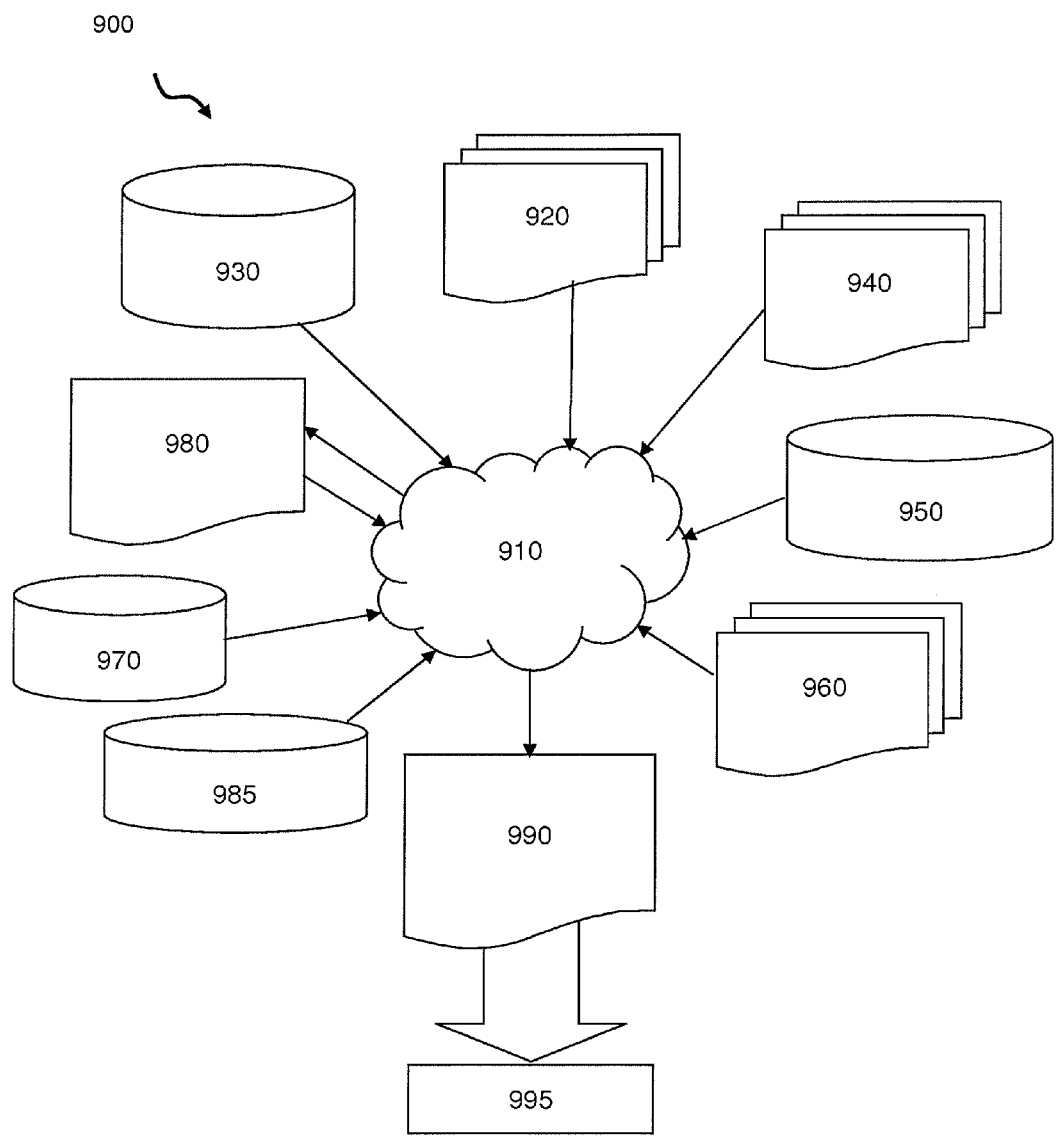
FIG. 16 is a flow diagram of a design process used in semiconductor design, manufacture, and/or test.

FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-15, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-15, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-15, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-15, for example. In one embodiment, design structure 990 may comprise a compiled, executable HDL simulation model that functionally simulates the devices shown in FIGS. 1-15, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-15, for example. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure comprising:
   a plurality of insulator layers in a trench structure; and
   a plurality of electrodes in the trench structure,
   wherein:
      each of the plurality of electrodes are provided in an alternating manner with each of the plurality of insulator layers;
      the at least each of the plurality of electrodes are planar to form contact regions for a plurality of capacitors formed from the plurality of insulator layers and the plurality of electrodes;
      the trench structure comprises:
         a first trench partially formed through a shallow isolation trench structure, the first trench having a first width; and
         a deep trench coaxially aligned with the first trench and extending into an underlying substrate, the deep trench having a second width different than the first width; and
      the deep trench forms tabbed portions on sides of the first trench as viewed from a top side.

2. The structure of claim 1, wherein the plurality of electrodes includes a conductive material on each of the plurality of insulator layers in the trench structure.

3. The structure of claim 2, wherein the conductive material is As doped polysilicon, boron doped polysilicon or WSi2.

4. The structure of claim 1, wherein:
   a first number of the alternating layers pinches off or closes a first of the tabbed portions; and
   a second number of the alternating layers pinches off or closes a second of the tabbed portions while raising a portion above the first tabbed portion.

5. The structure of claim 1, wherein the deep trench forms at least two tabbed portions on sides of the first trench and the alternating plurality of insulator material and electrode material fills a first of the two tabbed portions and a second of the two tabbed portions.

6. The structure of claim 1, further comprising sidewalls between an electrode of the plurality of electrodes and an adjacent insulator layer of the plurality of insulator layers.

7. The structure of claim 1, wherein one of the plurality of capacitors is formed from a substrate and one of the plurality of electrodes.

8. A structure comprising:
a trench structure with a stepped configuration in a substrate, the trench structure comprising:
   a first trench with a first width at least partially formed through a shallow isolation trench structure; and
   a second trench coaxially aligned with the first trench and extending into an underlying substrate, the second trench having a second width different than the first width, wherein the second trench forms tabbed portions on sides of the first trench as viewed from a top side;
a plurality of insulator layers in the trench structure;
a plurality of electrodes in the trench structure, wherein each of the plurality of electrodes are in an alternating manner with each of the plurality of insulator layers; and
at least each of the plurality of electrodes are planar.

9. A structure comprising:
a first trench with a first width at least partially formed in a shallow isolation trench structure;
a deep trench with a second width different from the first width, the deep trench formed coaxially aligned with the first trench and extending into a substrate such that the deep trench forms tabbed portions on sides of the first trench as viewed from a top side;
a first capacitor formed in the deep trench, the first capacitor comprising two electrode plates sandwiched between an insulator; and
a second capacitor formed in the deep trench, the second capacitor comprising two electrode plates separated by an insulator,
wherein the first capacitor and the second capacitor share a common electrode plate.

10. The structure of claim 9, wherein the substrate and an electrode plate of the two electrodes forming the first capacitor form a third capacitor.

11. The structure of claim 9, further comprising an insulator sidewall on the insulator forming the second capacitor, wherein the insulator sidewall further insulates the two electrode plates of the second capacitor.

* * * * *